United States Patent
Kwon et al.

(10) Patent No.: US 8,921,019 B2
(45) Date of Patent: Dec. 30, 2014

(54) POSITIVE PHOTOSENSITIVE RESIN COMPOSITION, AND PHOTOSENSITIVE RESIN LAYER AND DISPLAY DEVICE USING THE SAME

(75) Inventors: Ji-Yun Kwon, Uiwang-si (KR); Jin-Hee Kang, Uiwang-si (KR); Dae-Yun Kim, Uiwang-si (KR); Sang-Kyeon Kim, Uiwang-si (KR); Sang-Kyun Kim, Uiwang-si (KR); Sang-Soo Kim, Uiwang-si (KR); Kun-Bae Noh, Uiwang-si (KR); Eun-Kyung Yoon, Uiwang-si (KR); Jong-Hwa Lee, Uiwang-si (KR); Jun-Ho Lee, Uiwang-si (KR); Jin-Young Lee, Uiwang-si (KR); Hwan-Sung Cheon, Uiwang-si (KR); Hyun-Yong Cho, Uiwang-si (KR); Chung-Beom Hong, Uiwang-si (KR); Eun-Ha Hwang, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/603,479

(22) Filed: Sep. 5, 2012

(65) Prior Publication Data
US 2013/0171568 A1  Jul. 4, 2013

(30) Foreign Application Priority Data
Dec. 30, 2011  (KR) .................. 10-2011-0147388

(51) Int. Cl.
*G03F 7/023*  (2006.01)

(52) U.S. Cl.
USPC ............. 430/18; 430/165; 430/191; 430/192; 430/193; 430/906

(58) Field of Classification Search
CPC ..................................... G03F 7/0233
USPC ................ 430/18, 165, 191, 192, 193, 906
See application file for complete search history.

(56) References Cited

U.S. PATENT DOCUMENTS

| | | | |
|---|---|---|---|
| 2,772,975 A | 7/1955 | Rickers | |
| 2,797,213 A | 6/1957 | Moore | |
| 3,669,658 A | 6/1972 | Yonezawa et al. | |
| 6,929,890 B2 * | 8/2005 | Miyoshi et al. | 430/7 |
| 7,507,518 B2 | 3/2009 | Fujita et al. | |
| 2004/0197703 A1 * | 10/2004 | Miyoshi et al. | 430/270.1 |
| 2006/0246364 A1 | 11/2006 | Fujimori | |
| 2007/0184366 A1 | 8/2007 | Takakuwa | |
| 2008/0237553 A1 | 10/2008 | Miya et al. | |

FOREIGN PATENT DOCUMENTS

| | | |
|---|---|---|
| EP | 1496395 A2 | 1/2005 |
| JP | 63-096162 A | 4/1988 |
| JP | 1994-060140 A | 3/1994 |
| JP | 09-302221 A | 11/1997 |
| JP | 10-307393 A | 11/1998 |
| JP | 2000-292913 A | 10/2000 |
| JP | 2003-195490 A | 7/2003 |
| JP | 2004-145320 A | 5/2004 |
| JP | 2006-178437 A | 7/2006 |
| JP | 2009-235392 A | 10/2009 |
| KR | 10-2004-0087918 A | 10/2004 |
| KR | 10-2010-0080343 A | 7/2010 |
| TW | 200504464 | 2/2005 |

OTHER PUBLICATIONS

English-translation of Search Report in counterpart Taiwanese Application No. 101133134 dated Mar. 21, 2014, pp. 1.
Search Report in counterpart Taiwanese Application No. 101133134 dated Mar. 21, 2014, pp. 1.
Search Report in counterpart Chinese Application No. 201210351065.1 dated Apr. 15, 2014, pp. 1-3.
English-translation of Search Report in counterpart Chinese Application No. 201210351065.1 dated Apr. 15, 2014, pp. 1-2.

* cited by examiner

*Primary Examiner* — John Chu
(74) *Attorney, Agent, or Firm* — Additon, Higgins & Pendleton, P.A.

(57) ABSTRACT

Disclosed are a positive photosensitive resin composition that includes (A) an alkali soluble resin including a polybenzoxazole precursor, a polyimide precursor, or a combination thereof, (B) a photosensitive diazoquinone compound, (C) a phenol compound, (D) at least one organic dye having an absorption wavelength of about 400 nm to about 700 nm, and (E) a solvent, wherein the organic dye (D) is included in an amount of about 1 to about 40 parts by weight based on about 100 parts by weight of the alkali soluble resin (A), and a photosensitive resin layer and a display device using the same.

14 Claims, No Drawings

POSITIVE PHOTOSENSITIVE RESIN COMPOSITION, AND PHOTOSENSITIVE RESIN LAYER AND DISPLAY DEVICE USING THE SAME

CROSS-REFERENCE TO RELATED APPLICATIONS

This application claims priority to and the benefit of Korean Patent Application No. 10-2011-0147388 filed in the Korean Intellectual Property Office on Dec. 30, 2011, the entire disclosure of which is incorporated herein by reference.

FIELD

This disclosure relates to a positive photosensitive resin composition and a photosensitive resin layer and a display device using the same.

BACKGROUND

Conventional surface protective layers and interlayer insulating layers for semiconductor devices typically include a polyimide resin that can have excellent heat resistance, electrical properties, mechanical properties, and the like. The polyimide resin has recently been used as a photosensitive polyimide precursor composition which can be coated easily. The photosensitive polyimide precursor composition can be coated on a semiconductor device, patterned by ultraviolet (UV) rays, developed, and thermally imidized, to easily provide a surface protective layer, an interlayer insulating layer, and the like. The use of a photosensitive polyimide precursor may remarkably shorten processing times as compared with a conventional non-photosensitive polyimide precursor composition.

The photosensitive polyimide precursor composition can be a positive type in which an exposed part is dissolved by development or a negative type in which the exposed part is cured and maintained. Positive type compositions may be developed using a non-toxic alkali aqueous solution.

The positive photosensitive polyimide precursor composition can include a polyimide precursor of polyamic acid, a photosensitive material of diazonaphthoquinone, and the like. However, it can be difficult to obtain a desired pattern using the positive photosensitive polyimide precursor composition because the carboxylic acid of the polyamic acid can be too highly soluble in an alkali.

In order to solve this problem, Japanese Patent Laid-Open Publication No. 10-307393 discusses a material including phenolic hydroxyl acid instead of a carbonic acid provided by esterifying polyamic acid with an alcohol compound having at least one hydroxyl group. This composition, however, may be insufficiently developed and thus may result in layer loss or resin delamination from a substrate.

Recently, a material prepared by mixing a polybenzoxazole precursor with a diazonaphthoquinone compound (see for example Japanese Patent Laid-Open Publication No. 1994-060140) has drawn attention. When the polybenzoxazole precursor composition is actually used, however, film loss of an unexposed part can be significantly increased, so it can be difficult to obtain a desirable pattern after the developing process.

In order to improve this, if the molecular weight of the polybenzoxazole precursor is increased, the amount of film loss of the unexposed part can be reduced. Development residue (scum), however, can be generated, so resolution may be decreased and the development duration on the exposed part may be increased.

In order to solve this problem, film loss can be suppressed in unexposed parts during development by adding a certain phenol compound to a polybenzoxazole precursor. See, for example Japanese Patent Laid-Open Publication No. 9-302221 and Japanese Patent Laid-Open Publication No. 2000-292913. However, the effect of suppressing the film loss of the unexposed part is insufficient. Accordingly, there is still a need to increase the effects on suppressing the film loss, along with preventing generation of the development residue (scum). In addition, there is still a need for research directed to a dissolution-suppressing agent, since phenol compounds used to adjust or control solubility can decompose at high temperatures during curing, can undergo a side reaction, or the like, which can damage mechanical properties of a cured film.

The positive photosensitive resin composition including the polybenzoxazole precursor may be used as an organic insulator or a barrier rib material in a display device field. A liquid crystal display device, which is one kind of a display device, can have the advantages of being light and thin, inexpensive, being operated with a small consumption of electricity, having excellent junction with an integrated circuit, and the like and thus, has been widely used for various electronic devices such as laptop computers, monitors, and TV images. This liquid crystal display device can include a lower substrate having a black matrix, a color filter, an ITO pixel electrode, and an upper substrate having an active circuit portion including a liquid crystal layer, a thin film transistor, a capacitor layer, and an ITO pixel electrode. The color filter can be fabricated by sequentially laminating a black matrix layer with a predetermined pattern on a transparent substrate to block light at pixel boundaries and pixel parts including a plurality of colors, in general, three primary colors of red (R), green (G), and blue (B).

In addition, an organic light emitting diode (OLED) actively developed in recent times is arranged as a pixel with a matrix format. These pixels are arranged to emit the same color to fabricate a single color display or as three primary colors of red (R), green (G), and blue (B) to display various colors.

Many attempts have been recently made to develop a display device having high contrast ratio and high luminance. One of the attempts forms a black filter layer between color patterns but this may not provide a high aperture ratio and can lower heat resistance and insulating properties. Another attempt to provide a high aperture ratio includes making a non-light emitting region black and simultaneously improving contrast ratio and visibility but this can deteriorate the inherent properties of an insulation layer because a large amount of colorant is dissolved and used. In addition, while an inorganic pigment such as carbon black and the like used for a black mill-base (a colorant) generally can have excellent light shielding properties, it can also deteriorate insulating resistance properties, which is not desirable in an insulation layer for an organic light emitting diode.

In contrast, an organic pigment consisting of a pigment mixture may provide a black color and thus, can have better insulating resistance properties than the inorganic pigment. The organic pigment, however, but may need to be included in a larger amount than the inorganic pigment in a photosensitive resin composition to accomplish equivalent light shielding properties, which can possibly deteriorate pattern developability and can produce a residue.

SUMMARY

One embodiment provides positive photosensitive resin composition that can prevent light leakage.

Another embodiment provides a photosensitive resin layer using the positive photosensitive resin composition.

Further another embodiment provides a display device that can have excellent luminous efficiency, color expression rate, and insulating property by including the photosensitive resin layer.

According to one embodiment, provided is a positive photosensitive resin composition that includes (A) an alkali soluble resin including a polybenzoxazole precursor, a polyimide precursor, or a combination thereof, (B) a photosensitive diazoquinone compound, (C) a phenol compound, (D) at least one organic dye having an absorption wavelength of about 400 nm to about 700 nm, and (E) a solvent, wherein the organic dye (D) is included in an amount of about 1 to about 40 parts by weight based on about 100 parts by weight of the alkali soluble resin (A).

The photosensitive resin composition including the organic dye may prevent light leakage by using a high durable dye absorbing light having a predetermined wavelength band in a patterning material to improve the luminous efficiency. The color expression rate can be enhanced by adding the dye even in a small amount, and the coating property can be improved because the dye can be dissolved in organic solute instead of used as a dispersion, thus eliminating the need for an additional dispersing agent.

The polybenzoxazole precursor may include a repeating unit represented by the following Chemical Formula 1, or repeating units represented by the following Chemical Formulae 1 and 2, and may include a thermally polymerizable functional group at at least one terminal end thereof.

[Chemical Formula 1]

$$*\!-\!\!\left[\!-\!NH\!-\!\underset{\underset{OH}{|}}{\overset{\overset{OH}{|}}{X_1}}\!-\!NH\!-\!\overset{O}{\overset{\|}{C}}\!-\!Y_1\!-\!\overset{O}{\overset{\|}{C}}\!-\!\right]\!-\!*$$

[Chemical Formula 2]

$$*\!-\!\!\left[\!-\!NH\!-\!X_2\!-\!NH\!-\!\overset{O}{\overset{\|}{C}}\!-\!Y_2\!-\!\overset{O}{\overset{\|}{C}}\!-\!\right]\!-\!*$$

In Chemical Formulae 1 and 2, $X_1$ is an aromatic organic group or tetravalent to hexavalent aliphatic organic group, $Y_1$ and $Y_2$ are the same or different and are each independently an aromatic organic group or divalent to hexavalent aliphatic organic group, and $X_2$ is an aromatic organic group, divalent to hexavalent aliphatic organic group, divalent to hexavalent alicyclic organic group, or an organic group represented by the following Chemical Formula 3,

[Chemical Formula 3]

$$*\!-\!R_{27}\!-\!\underset{\underset{R_{24}}{|}}{\overset{\overset{R_{23}}{|}}{Si}}\!-\!\!\left[\!-\!O\!-\!\underset{\underset{R_{26}}{|}}{\overset{\overset{R_{25}}{|}}{Si}}\!-\!\right]_k\!\!R_{28}\!-\!*$$

wherein, in Chemical Formula 3, $R_{23}$ to $R_{26}$ are the same or different and are each independently substituted or unsubstituted alkyl, substituted or unsubstituted aryl, substituted or unsubstituted alkoxy, or hydroxy, $R_{27}$ and $R_{28}$ are the same or different and are each independently substituted or unsubstituted alkylene or substituted or unsubstituted arylene, and k is an integer ranging from 1 to 50. The thermally polymerizable functional group may be derived from a reactive end-capping monomer. Examples of the reactive end-capping monomer include without limitation monoamines including carbon-carbon double bonds, monoanhydrides including carbon-carbon double bonds, and combinations thereof.

The monoanhydrides including a carbon-carbon double bond may include without limitation 5-norbornene-2,3-dicarboxyl anhydride represented by the following Chemical Formula 9; 3,6-epoxy-1,2,3,6-tetrahydrophthalic anhydride represented by the following Chemical Formula 10; isobutenyl succinic anhydride represented by the following Chemical Formula II; maleic anhydride; aconitic anhydride, and combinations thereof.

[Chemical Formula 9]

[Chemical Formula 10]

[Chemical Formula 11]

The polyimide precursor may include repeating units represented by the following Chemical Formula 50 and the following Chemical Formula 51.

[Chemical Formula 50]

$$*\!-\!\!\left[\!-\!X_3\!-\!\overset{O}{\overset{\|}{C}}\!-\!\underset{R_{100}OOC}{\overset{}{Y_3}}\!-\!\overset{O}{\overset{\|}{C}}\!-\!\right]\!-\!*$$
$\phantom{xxxxxxxx}R_{100}OOC\phantom{xx}COOR_{101}$

[Chemical Formula 51]

$$*\!-\!\!\left[\!-\!NH\!-\!X_4\!-\!NH\!-\!\overset{O}{\overset{\|}{C}}\!-\!Y_4\!-\!\overset{O}{\overset{\|}{C}}\!-\!\right]\!-\!*$$
$\phantom{xxxxxxxxxx}R_{102}OOC\phantom{xx}COOR_{103}$ In Chemical Formulae 50 and 51, $X_3$ is an aromatic organic group or divalent to hexavalent alicyclic organic group, $Y_3$ and $Y_4$ are the same or different and are each independently an aromatic organic group or tetravalent to hexavalent alicyclic organic group, $X_4$ is an aromatic organic group, divalent to hexavalent alicyclic organic group, or a functional group represented by the above Chemical Formula 3, and $R_{100}$ to $R_{103}$ are the same or different and are each independently hydrogen or substituted or unsubstituted C1 to C20 alkyl.

The organic dye (D) may have an absorption wavelength of about 590 nm to about 700 nm.

The organic dye (D) may include a methine-based compound.

The methine-based compound may be a compound represented by the following Chemical Formula 28.

[Chemical Formula 28]

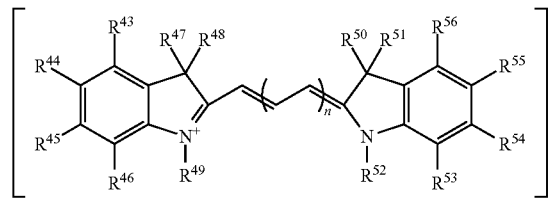

In Chemical Formula 28, $R^{43}$ to $R^{46}$ and $R^{53}$ to $R^{56}$ are the same or different and are each independently hydrogen, halogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocloalkenyl, substituted or unsubstituted C2 to C20 heterocloalkynyl, substituted or unsubstituted C6 to C30 aryl, or substituted or unsubstituted C2 to C30 heteroaryl, $R^{47}$, $R^{48}$, $R^{50}$ and $R^{51}$ are the same or different and are each independently hydrogen or substituted or unsubstituted C1 to C20 alkyl, $R^{49}$ and $R^{52}$ are the same or different and are each independently hydrogen, substituted or unsubstituted C1 to C20 alkyl, substituted or unsubstituted C1 to C20 alkyl(meth)acrylate, or substituted or unsubstituted C6 to C30 aryl, n is an integer ranging from 1 to 4, and A is halogen, $ClO_4^-$, $BF_4^-$, $SbF_6^-$, $CF_3SO_3^-$ or $N(SO_2CF_3)_2^-$.

The methine-based compound may include a compound represented by the following Chemical Formula 29.

[Chemical Formula 29]

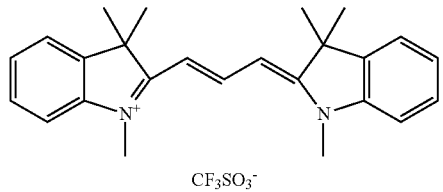

The organic dye (D) may further include an azo-based compound, and the azo-based compound may include a compound represented by the following Chemical Formula 30.

[Chemical Formula 30]

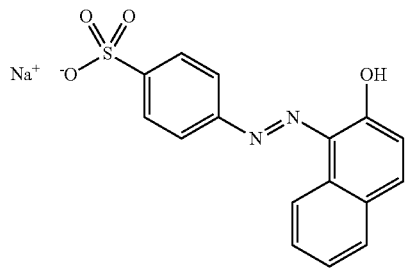

Examples of the solvent (E) may include without limitation N-methyl-2-pyrrolidone, γ-butyrolactone, N,N-dimethyl acetamide, dimethylsulfoxide, diethyleneglycoldimethylether, diethyleneglycoldiethylether, diethyleneglycoldibutylether, propyleneglycolmonomethylether, dipropyleneglycolmonomethylether, propyleneglycolmonomethyletheracetate, methyllactate, ethyllactate, butyllactate, methyl-1,3-butyleneglycolacetate, 1,3-butyleneglycol-3-monomethylether, methyl pyruvate, ethyl pyruvate, methyl-3-methoxy propionate, cyclohexanone, and the like, and combinations thereof.

The positive photosensitive resin composition may further include a silane compound.

The positive photosensitive resin composition may include about 5 to about 100 parts by weight of the photosensitive diazoquinone compound (B), about 1 to about 30 parts by weight of the phenol compound (C), and about 100 to about 400 parts by weight of the solvent (E), each based on about 100 parts by weight of the alkali soluble resin (A).

According to another embodiment, a photosensitive resin layer prepared using the positive photosensitive resin composition is provided.

According to a further embodiment, a display device including the photosensitive resin layer is provided.

The positive photosensitive resin composition may provide a semiconductor device that can have excellent luminous efficiency, color expression rate, and insulating property by including an organic dye absorbing a wavelength of predetermined range.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" refers to C1 to C30 alkyl, the term "alkoxy" may refer to C1 to C30 alkoxy, for example C1 to C18 alkoxy, the term "aryl" refers to C6 to C30 aryl, the term "arylalkyl" refers to C7 to C30 arylalkyl, the term "alkylene" refers to C1 to C20 alkylene, and the term "alkoxylene" refers to C1 to C20 alkoxylene.

As used herein, when a specific definition is not otherwise provided, the term "substituted" refers to one substituted with at least a substituent including halogen (F, Cl, Br, or I), a hydroxy group, a nitro group, a cyano group, an imino group (=NH, =NR, wherein R is C1 to C10 alkyl), an amino group (—NH$_2$, —NH(R'), —N(R")(R'''), wherein R' to R''' are the same or different and are each independently C1 to C10 alkyl), an amidino group, a hydrazine group, a hydrazone group, a carboxyl group, substituted or unsubstituted C1 to C30 alkyl, substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, or a combination thereof in place of at least one hydrogen of a functional group.

As used herein, when a definition is not otherwise provided, the term "hetero" may refer to one including a heteroatom including N, O, S, P or a combination thereof in place of a carbon atom in a ring.

As used herein, when a definition is not otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" may refer to C3 to C30 cycloalkyl, C3 to C30 cycloalkenyl, a C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, and the term "aromatic organic group" may refer to C6 to C30 aryl or C6 to C30 arylene, for example C6 to C16 aryl or C6 to C16 arylene.

Also, "*" refers to a linking part between the same or different atoms, or Chemical Formulae.

According to one embodiment, a positive photosensitive resin composition includes (A) an alkali soluble resin including a polybenzoxazole precursor, a polyimide precursor, or a combination thereof; (B) a photosensitive diazoquinone compound; (C) a phenol compound; (D) at least one organic dye having an absorption wavelength of about 400 nm to about 700 nm; and (E) a solvent, wherein the organic dye (D) is included in an amount of about 1 to about 40 parts by weight based on about 100 parts by weight of the alkali soluble resin.

The positive photosensitive resin composition may effectively prevent the light leakage by including the organic dye and absorbing light having a predetermined wavelength range, so as to enhance the luminance of display device and to improve the contrast ratio, the luminous efficiency, and the color purity.

Hereinafter, each component of the positive photosensitive resin composition is described in detail.

(A) Alkali Soluble Resin

The alkali soluble resin may include a polybenzoxazole precursor, a polyimide precursor, or a combination thereof.

The polybenzoxazole precursor may include a repeating unit represented by the following Chemical Formula 1, or repeating units represented by the following Chemical Formulae 1 and 2, and may include a thermally polymerizable functional group at at least one terminal end thereof.

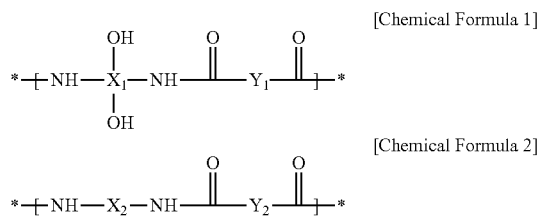

[Chemical Formula 1]

[Chemical Formula 2]

In Chemical Formulae 1 and 2, $X_1$ is an aromatic organic group or tetravalent to hexavalent aliphatic organic group, $Y_1$ and $Y_2$ are the same or different and are each independently an aromatic organic group or divalent to hexavalent aliphatic organic group, $X_2$ is an aromatic organic group, divalent to hexavalent aliphatic organic group, divalent to hexavalent alicyclic organic group, or an organic group represented by the following Chemical Formula 3.

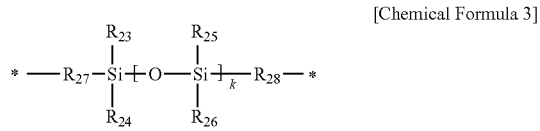

[Chemical Formula 3]

In Chemical Formula 3, $R_{23}$ to $R_{26}$ are the same or different and are each independently substituted or unsubstituted alkyl, substituted or unsubstituted aryl, substituted or unsubstituted alkoxy, or hydroxy, $R_{27}$ and $R_{28}$ are the same or different and are each independently substituted or unsubstituted alkylene or substituted or unsubstituted arylene, and k is an integer ranging from 1 to 50.

The polybenzoxazole precursor is not limited to a specific form and may be a random, block, or alternating copolymer.

When the polybenzoxazole precursor includes both repeating units represented by Chemical Formulae 1 and 2, the repeating unit represented by Chemical Formula 1 may be included at an amount of more than or equal to about 60 mol % and less than about 100 mol %.

Examples of $X_1$ may include without limitation a residual group derived from 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2'-bis(3-amino-4-hydroxy-5-trifluoromethylphenyl)hexafluoropropane, 2,2'-bis(3-amino-4-hydroxy-6-trifluoromethylphenyl)hexafluoropropane, 2,2'-bis(3-amino-4-hydroxy-2-trifluoromethylphenyl)hexafluoropropane, 2,2'-bis(4-amino-3-hydroxy-5-trifluoromethylphenyl)hexafluoropropane, 2,2'-bis(4-amino-3-hydroxy-6-trifluoromethylphenyl)hexafluoropropane, 2,2'-bis(4-amino-3-hydroxy-2-trifluoromethylphenyl)hexafluoropropane, 2,2'-bis(3-amino-4-hydroxy-5-pentafluoroethylphenyl)hexafluoropropane, 2-(3-amino-4-hydroxy-5-trifluoromethylphenyl)-2'-(3-amino-4-hydroxy-5-pentafluoroethylphenyl)hexafluoropropane, 2-(3-amino-4-hydroxy-5-trifluoromethylphenyl)-2'-(3-hydroxy-4-amino-5-trifluoro methylphenyl)hexafluoropropane, 2-(3-amino-4-hydroxy-5-trifluoromethylphenyl)-2'-(3-hydroxy-4-amino-6-trifluoro methylphenyl)hexafluoropropane, 2-(3-amino-4-hydroxy-5-trifluoromethylphenyl)-2'-(3-hydroxy-4-amino-2-trifluoro methylphenyl)hexafluoropropane, 2-(3-amino-4-hydroxy-2-trifluoromethylphenyl)-2'-(3-hydroxy-4-amino-5-trifluoro methylphenyl)hexafluoropropane, 2-(3-amino-4-hydroxy-6-trifluoromethylphenyl)-2'-(3-hydroxy-4-amino-5-trifluoro methylphenyl)hexafluoropropane, 2,6-bis[[[5-[1-(amino-4-hydroxyphenyl)-2,2,2-trifluoro-1-(trifluoromethyl)ethyl]-2-hydroxyphenyl]amino]methyl]-4-methylphenol, and the like, and combinations thereof.

$X_1$ may be a residual group represented by the following Chemical Formula 4, Chemical Formula 5, or a combination thereof.

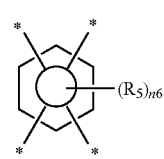

[Chemical Formula 4]

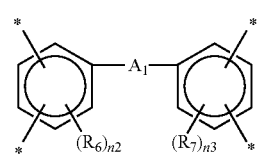

[Chemical Formula 5]

In Chemical Formulae 4 and 5, $A_1$ is O, CO, $CR_8R_9$, $SO_2$, S, or a single bond, $R_5$ to $R_7$ are the same or different and are each independently hydrogen, substituted or unsubstituted alkyl, a hydroxy group, a carboxylic acid group, or a thiol group, $n_1$ is an integer of 1 to 2, and $n_2$ and $n_3$ are the same or different and are each independently an integer of 1 to 3.

$X_2$ may be a residual group derived from aromatic diamine, alicyclic diamine, or silicon diamine.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, and the like, and combinations thereof. The aromatic diamine may be used singularly or as a mixture thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

Examples of the alicyclic diamine may include without limitation cyclohexyldiamine, methylenebiscyclohexylamine, and the like, and combinations thereof.

The alicyclic diamine may be used singularly or as a mixture thereof, and the aromatic diamine, silicon diamine, and/or alicyclic diamine may be mixed in an appropriate ratio.

$Y_1$ and $Y_2$ may be a residual group derived from a dicarboxylic acid or a residual group derived from a dicarboxylic acid derivative.

Examples of the dicarboxylic acid include $Y(COOH)_2$ (wherein Y is the same as $Y_1$ and $Y_2$).

Examples of the dicarboxylic acid derivative include without limitation carbonyl halide derivatives or active compounds of an active ester derivative obtained by reacting $Y(COOH)_2$ with 1-hydroxy-1,2,3-benzotriazole. Examples of the dicarboxylic acid derivative include without limitation 4,4'-oxydibenzoylchloride, diphenyloxydicarboxylic acid chloride, bis(phenylcarboxylic acid chloride)sulfone, bis(phenylcarboxylic acid chloride)ether, bis(phenylcarboxylic acid chloride)phenone, phthalic carboxylic acid dichloride, terephthalic acid dichloride, isophthalic carboxylic acid dichloride, carboxylic acid dichloride, diphenyloxydicarboxylate benzotriazole and the like, and combinations thereof.

$Y_1$ and $Y_2$ may be functional groups represented by one of the following Chemical Formulae 6 to 8 or a combination thereof.

[Chemical Formula 6]

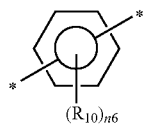

[Chemical Formula 7]

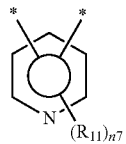

[Chemical Formula 8]

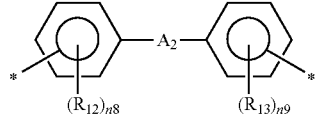

In Chemical Formulae 6 to 8, $R_{10}$ to $R_{13}$ are the same or different and are each independently hydrogen or substituted or unsubstituted alkyl, $n_6$, $n_8$, and $n_9$ are the same or different and are each independently an integer of 1 to 4, $n_7$ is an integer of 1 to 3, and $A_2$ is O, $CR_{14}R_{15}$, CO, CONH, S, or $SO_2$, wherein $R_{14}$ and $R_{15}$ are the same or different and are each independently hydrogen, substituted or unsubstituted alkyl, or fluoroalkyl.

The polybenzoxazole precursor may include a thermally polymerizable functional group derived from a reactive end-capping monomer at at least one terminal end of branched chain of the polybenzoxazole precursor.

Examples of the reactive end-capping monomer may include without limitation monoamines including double bonds, monoanhydrides including double bonds, and the like, and combinations thereof.

Examples of the monoamines including double bonds may include without limitation toluidine, dimethylaniline, ethylaniline, aminophenol, aminobenzyl alcohol, aminoindan, aminoacetophenone, and the like, and combinations thereof.

Examples of the monoanhydrides including the double bond may include without limitation 5-norbornene-2,3-dicarboxyl anhydride represented by the following Chemical Formula 9, 3,6-epoxy-1,2,3,6-tetrahydrophthalic anhydride represented by the following Chemical Formula 10, isobutenyl succinic anhydride represented by the following Chemical Formula II, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), and the like, and combinations thereof.

[Chemical Formula 9]

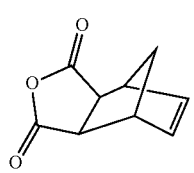

[Chemical Formula 10]

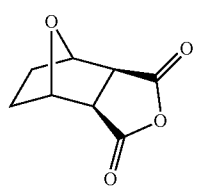

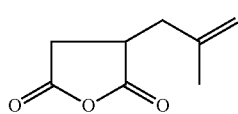

The following Chemical Formulae 12 to 16 are examples of the thermally polymerizable functional group that is positioned at the terminal end of the polybenzoxazole precursor. The thermally polymerizable functional group may be cross-linked during a heating step of the polybenzoxazole precursor preparation process.

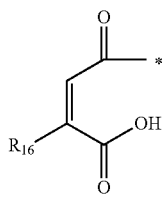

In Chemical Formula 12, $R_{16}$ is H, $CH_2COOH$, or $CH_2CHCHCH_3$.

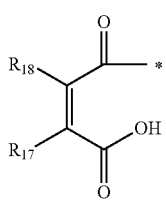

In Chemical Formula 13, $R_{17}$ and $R_{18}$ are the same or different and are each independently H or $CH_3$.

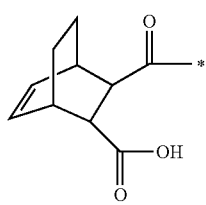

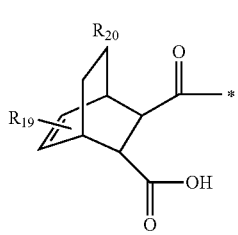

In Chemical Formula 15, $R_{10}$ is H or $CH_3$, and $R_{20}$ is $CH_2$ or oxygen.

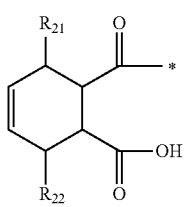

In Chemical Formula 16, $R_{21}$ and $R_{22}$ are the same or different and are each independently, H, $CH_3$, or $OCOCH_3$.

The polybenzoxazole precursor can have a weight average molecular weight (Mw) ranging from about 3,000 to about 300,000. When the polybenzoxazole precursor has a weight average molecular weight within the above range, sufficient physical properties and excellent solubility to the organic solvent may be provided.

The polyimide precursor may further include repeating units represented by the following Chemical Formula 50, Chemical Formula 51 or a combination thereof. The repeating unit represented by following Chemical Formula 50 can enable rapid resin curing at a high temperature, and the repeating unit represented by the following Chemical Formula 51 can improve thermal properties when being cured at a high temperature.

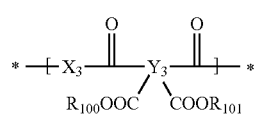

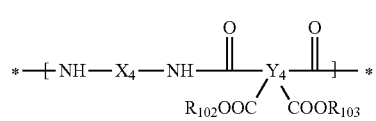

In Chemical Formulae 50 to 51, $X_3$ is an aromatic organic group or a divalent to hexavalent alicyclic organic group, $Y_3$ and $Y_4$ are the same or different and are each independently an aromatic organic group or a tetravalent to hexavalent alicyclic organic group, $X_4$ is an aromatic organic group, a divalent to hexavalent alicyclic organic group, or the functional group represented by the above Chemical Formula 3, and $R_{100}$ to $R_{103}$ are the same or different and are each independently hydrogen or substituted or unsubstituted C1 to C20 alkyl.

In the positive photosensitive resin composition, based on the sum (that is based on 100 mol %) of the repeating unit represented by the above Chemical Formula 50 and the repeating unit represented by the above Chemical Formula 51, the repeating unit represented by the above Chemical Formula 50 and the repeating unit represented by the above Chemical Formula 51 may be included in an amount of about 5 mol % to about 50 mol % and about 50 mol % to about 95 mol %, respectively.

The polyimide precursor may have a weight average molecular weight (Mw) of about 3,000 to about 300,000.

(B) Photosensitive Diazoquinone Compound

The photosensitive diazoquinone compound may be a compound including a 1,2-benzoquinone diazide or 1,2-naphtoquinone diazide structure.

The photosensitive diazoquinone compound may include a compound represented by one of the following Chemical Formula 17 and Chemical Formulae 19 to 21, or a combination thereof, but is not limited thereto.

[Chemical Formula 17]

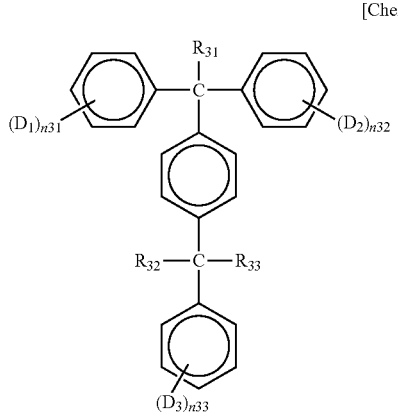

In Chemical Formula 17, $R_{31}$ to $R_{33}$ are the same or different and are each independently hydrogen or substituted or unsubstituted alkyl, for example $CH_3$, $D_1$ to $D_3$ are the same or different and are each independently OQ, wherein Q is hydrogen, or the following Chemical Formula 18a or 18b, provided that all Qs are not simultaneously hydrogen, and $n_{31}$ to $n_{33}$ are the same or different and are each independently an integer ranging from 1 to 3.

[Chemical Formula 18a]

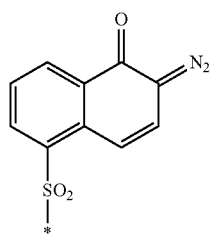

[Chemical Formula 18b]

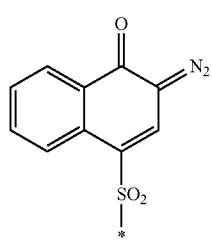

[Chemical Formula 19]

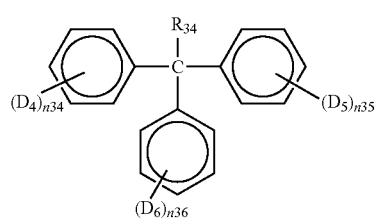

In Chemical Formula 19, $R_{34}$ is hydrogen or substituted or unsubstituted alkyl, $D_4$ to $D_6$ are OQ, wherein Q is the same as defined in Chemical Formula 17, and $n_{34}$ to $n_{36}$ are the same or different and are each independently an integer ranging from 1 to 3.

[Chemical Formula 20]

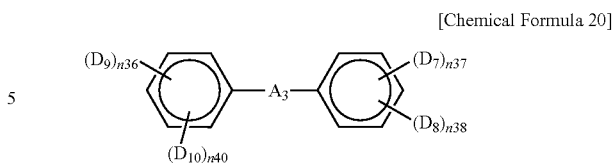

In Chemical Formula 20, $A_3$ is CO or CRR', wherein R and R' are the same or different and are each independently substituted or unsubstituted alkyl, $D_7$ to $D_{10}$ are the same or different and are each independently hydrogen, substituted or unsubstituted alkyl, OQ, or NHQ, wherein Q is the same as defined in Chemical Formula 17, $n_{37}$, $n_{38}$, $n_{39}$ and $n_{40}$ are the same or different and are each independently an integer ranging from 1 to 4, and $n_{37}+n_{38}$ and $n_{39}+n_{40}$ are the same or different and are each independently an integer of less than or equal to 5, provided that at least one of $D_7$ to $D_8$ is OQ, and one aromatic ring includes one to three OQs and the other aromatic ring includes one to four OQs.

[Chemical Formula 21]

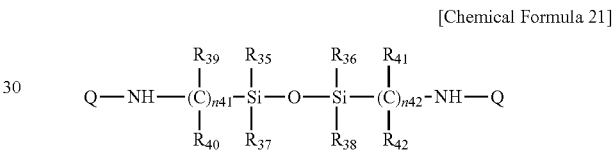

In Chemical Formula 21, $R_{35}$ to $R_{42}$ are the same or different and are each independently hydrogen or substituted or unsubstituted alkyl, $n_{41}$ and $n_{42}$ are the same or different and are each independently an integer of 1 to 5, for example an integer of 2 to 4, and each Q is the same as defined in Chemical Formula 17.

The photosensitive resin composition may include the photosensitive diazoquinone compound in an amount of about 5 to about 100 parts by weight based on about 100 parts by weight of the alkali soluble resin. In some embodiments, the photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99 or 100 parts by weight. Further, according to some embodiments of the present invention, the amount of photosensitive diazoquinone compound can be in a range from about any When the amount of the photosensitive diazoquinone compound is within the above range, the pattern can be well-formed with minimal or no residue from exposure, and film thickness loss during development can be minimized or prevented to provide a good pattern.

(C) Phenol Compound

The phenol compound can increase dissolution rate and sensitivity of exposed parts during development using an alkali aqueous solution and can play a role in forming high resolution patterns.

Examples of the phenol compound may include without limitation 2,6-dimethoxymethyl-4-t-butyl phenol, 2,6- dimethoxymethyl-p-cresol, 2,6-diacetoxymethyl-p-cresol, and the like, and combinations thereof.

The phenol compound may be a compound represented by one of the following Chemical Formulae 22 to 27, or a combination thereof, but is not limited thereto.

[Chemical Formula 22]

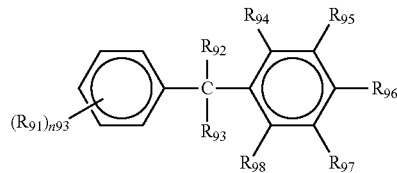

In Chemical Formula 22, $R_{91}$ to $R_{93}$ are the same or different and are each independently hydrogen or substituted or unsubstituted alkyl, $R_{94}$ to $R_{98}$ are the same or different and are each independently H, OH, or substituted or unsubstituted alkyl, for example $CH_3$, and $n_{91}$ is an integer of 1 to 5.

[Chemical Formula 23]

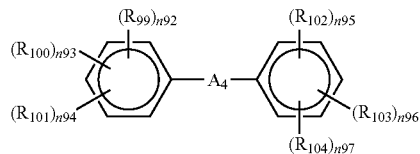

In Chemical Formula 23, $R_{99}$ to $R_{104}$ are the same or different and are each independently H, OH, or substituted or unsubstituted alkyl, $A_4$ is CR'R" or a single bond, wherein R' and R" are the same or different and are each independently hydrogen or substituted or unsubstituted alkyl group, for example $CH_3$, and $n_{92}+n_{93}+n_{94}$ and $n_{95}+n_{96}+n_{97}$ are the same or different and are each independently integers less than or equal to 5.

[Chemical Formula 24]

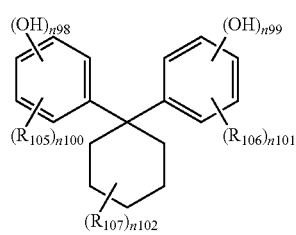

In Chemical Formula 24, $R_{105}$ to $R_{107}$ are the same or different and are each independently hydrogen or a substituted or unsubstituted alkyl, $n_{98}$, $n_{99}$ and $n_{102}$ are the same or different and are each independently integers of 1 to 5, and $n_{100}$ and $n_{101}$ are the same or different and are each independently integers of 0 to 4.

[Chemical Formula 25]

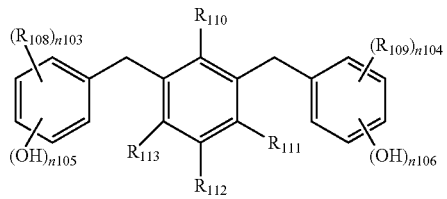

In Chemical Formula 25, $R_{108}$ to $R_{113}$ are the same or different and are each independently hydrogen, OH, or substituted or unsubstituted alkyl, $n_{103}$ to $n_{106}$ are the same or different and are each independently integers ranging from 1 to 4, and $n_{103}+n_{105}$ and $n_{104}+n_{106}$ are the same or different and are each independently integers of less than or equal to 5.

[Chemical Formula 26]

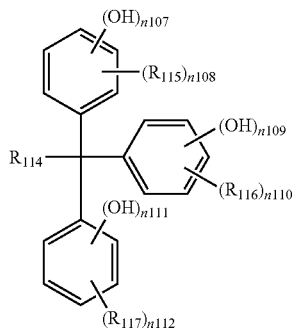

In Chemical Formula 26, $R_{114}$ is substituted or unsubstituted alkyl, for example $CH_3$, $R_{115}$ to $R_{117}$ are the same or different and are each independently hydrogen or substituted or unsubstituted alkyl, $n_{107}$, $n_{109}$, and $n_{111}$ are the same or different and are each independently integers of 1 to 5, $n_{108}$, $n_{110}$ and $n_{112}$ are the same or different and are each independently integers of 0 to 4, and $n_{107}+n_{108}$, $n_{109}+n_{110}$, and $n_{111}+n_{112}$ are the same or different and are each independently integers of less than or equal to 5.

[Chemical Formula 27]

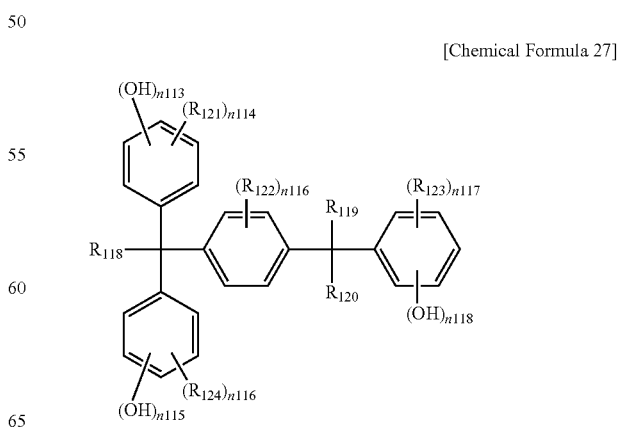

In Chemical Formula 27, $R_{118}$, $R_{119}$ and $R_{120}$ are the same or different and are each independently substituted or unsubstituted alkyl, for example $CH_3$, $R_{121}$ to $R_{124}$ are the same or different and are each independently hydrogen or substituted or unsubstituted alkyl, $n_{113}$, $n_{115}$, and $n_{118}$ are the same or different and are each independently integers of 1 to 5, $n_{114}$, $n_{116}$, and $n_{117}$ are the same or different and are each independently integers of 0 to 4, $n_{119}$ is an integer of 1 to 4, and $n_{117}+n_{118}$ are the same or different and are each independently integers of less than or equal to 5.

The photosensitive resin composition may include the phenol compound in an amount of about 1 to about 30 parts by weight based on about 100 parts by weight of the alkali soluble resin. In some embodiments, the photosensitive resin composition may include the phenol compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of phenol compound can be in a range from about any of the foregoing amounts to about any other of the foregoing amounts.

When the phenol compound is included in an amount within the above range, sensitivity during development may be improved, and the dissolubility of the non-exposed part may be suitably increased to provide a good pattern. In addition, precipitation during freezing may not occur, so excellent storage stability may be realized.

(D) Organic Dye

The organic dye is a kind of dye having an absorption wavelength of about 400 nm to about 700 nm, and the positive photosensitive resin composition including the organic dye may absorb light having a wavelength of about 400 nm to about 700 nm.

On the other hand, the organic dye having an adsorption wavelength of about 400 nm to about 700 nm may have an absorption wavelength of range of about 590 to about 700 nm, for example, an absorption wavelength of range of about 610 to about 700 nm.

Examples of an organic dye having an absorption wavelength within the above range may include without limitation methine-based compounds such as azomethine-based compounds, polymethine-based compounds, and the like, and combinations thereof. An exemplary methine-based compound may include a compound represented by the following Chemical Formula 28.

[Chemical Formula 28]

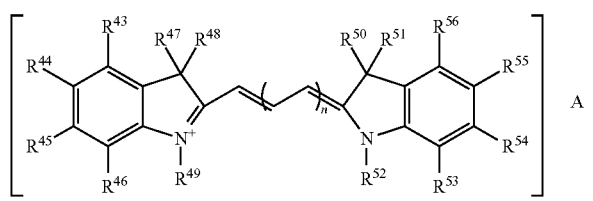

In Chemical Formula 28, $R^{43}$ to $R^{46}$ and $R^{53}$ to $R^{56}$ are the same or different and are each independently hydrogen, halogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $R^{47}$, $R^{48}$, $R^{50}$, and $R^{51}$ are the same or different and are each independently hydrogen or substituted or unsubstituted C1 to C20 alkyl, $R^{49}$ and $R^{52}$ are the same or different and are each independently hydrogen, substituted or unsubstituted C1 to C20 alkyl, substituted or unsubstituted C1 to C20 alkyl(meth)acrylate, or substituted or unsubstituted C6 to C30 aryl, for example substituted or unsubstituted C1 to C20 alkyl, n is an integer ranging from 1 to 4, and A is halogen, $ClO_4^-$, $BF_4^-$, $SbF_6^-$, $CF_3SO_3^-$, or $N(SO_2CF_3)_2^-$, for example, $CF_3SO_3^-$ or $N(SO_2CF_3)_2^-$.

The compound represented by the above Chemical Formula 28 may be represented by the following Chemical Formula 29.

[Chemical Formula 29]

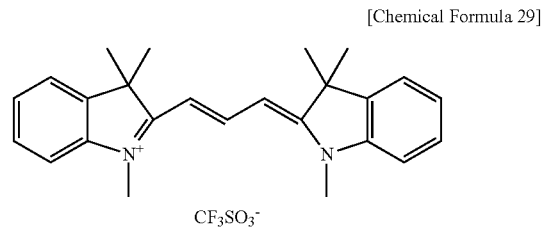

The organic dye may further include an azo-based compound.

The azo-based compound may include a compound represented by the following Chemical Formula 30.

[Chemical Formula 30]

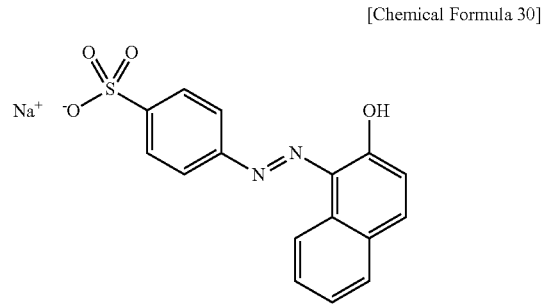

When the organic dye including the methine-based compound and the azo-based compound is used, the methine-based compound and the azo-based compound may be included in a weight ratio of 9:1 to 5:5.

The organic dye including the methine-based compound may have absorbance rate of greater than or equal to about 80% at the maximum absorption wavelength range of about 400 to about 700 nm, particularly, the absorbance rate is further enhanced when the maximum absorption wavelength ranges from about 610 to about 700 nm. Accordingly, since the positive photosensitive resin composition absorbs lights having a wavelength range of about 400 nm to about 700 nm with a high efficiency, the light leakage of the green region leaked from between the RGB patterns can be effectively absorbed when applied to a black matrix, so as to prevent deteriorating the color expression rate of a pixel layer and deteriorating the luminance and the contrast ratio.

As noted above, the positive photosensitive resin composition can prevent light leakage by absorbing light having a predetermined wavelength range, and thus an inorganic pigment or organic pigment for shielding light is not necessarily included. Accordingly, problems such as deteriorated insulating property, pattern developability, and residue removal rate, caused by using an inorganic pigment and an organic pigment, may be solved. Furthermore, since the dye used in the present invention is not used for shielding the light but for preventing light leakage, the light leakage phenomenon may be minimized or prevented even when using a small amount of organic dye instead of using a large amount of organic pigment, so the positive photosensitive resin composition may improve the luminous efficiency and the color expressing ratio without deteriorating characteristics such as the sensitivity and the patterning developabilty of the positive photosensitive resin composition.

The photosensitive resin composition may include the organic dye in an amount of about 1 to 40 parts by weight, for example about 1 to 20 parts by weight, and as another example about 5 to 10 parts by weight, based on about 100 parts by weight of alkali soluble resin. In some embodiments, the photosensitive resin composition may include the organic dye in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 parts by weight. Further, according to some embodiments of the present invention, the amount of organic dye can be in a range from about any of the foregoing amounts to about any other of the foregoing amounts.

When photosensitive resin composition includes the organic dye in an amount within the above range, the residue removal rate and the luminance may be remarkably improved without deteriorating film residue ratio, sensitivity, and insulating property of the photosensitive resin composition.

The positive photosensitive composition may further include another colorant along with (in addition to) the methine-based compound having an absorption wavelength of about 400 nm to about 700 nm. Examples of the other colorant may include without limitation a dye such as but not limited to a direct dye, an acidic dye, a basic dye, an acidic mordant dye, a sulfur dye, a reduction dye, an azoic dye, a dispersion dye, a reactive dye, an oxidation dye, an alcohol-soluble dye, an azo dye, an anthraquinone dye, an indigoid dye, a carbonium ion dye, a phthalocyanine dye, a nitro dye, a quinoline dye, a cyanine dye, and a polyxanthene dye, and the like; a pigment such as but not limited to C.I. pigment 1, 2, 3, 4, 5, 6, 7, 8, 9, 12, 14, 15, 16, 17, 21, 22, 23, 31, 32, 37, 38, 41, 47, 48, 48:1, 48:2, 48:3, 48:4, 49, 49:1, 49:2, 50:1, 52:1, 52:2, 53, 53:1, 53:2, 53:3, 57, 57:1, 57:2, 58:4, 60, 63, 63:1, 63:2, 64, 64:1, 68, 69, 81, 81:1, 81:2, 81:3, 81:4, 83, 88, 90:1, 101, 101:1, 104, 108, 108:1, 109, 112, 113, 114, 122, 123, 144, 146, 147, 149, 151, 166, 168, 169, 170, 172, 173, 174, 175, 176, 177, 178, 179, 181, 184, 185, 187, 188, 190, 193, 194, 200, 202, 206, 207, 208, 209, 210, 214, 216, 220, 221, 224, 230, 231, 232, 233, 235, 236, 237, 238, 239, 242, 243, 245, 247, 249, 250, 251, 253, 254, 255, 256, 257, 258, 259, 260, 262, 263, 264, 265, 266, 267, 268, 269, 270, 271, 272, 273, 274, 275, 276, and the like; and combinations thereof. In one embodiment, C.I. pigment red 48:1, 122, 168, 177, 202, 206, 207, 209, 224, 242, 254 may be preferably mixed, for example C.I. pigment red 177, 209, 224, 254 may be mixed.

When the positive photosensitive composition including the methine-based compound and the colorant is used, the methine-based compound and the colorant may be included in a weight ratio of 9:1 to 1:9.

The organic dye is a highly durable colorant material that exists in a particle phase rather than a dispersion phase in a solvent compared with an organic pigment, and thus may not damage a surface morphology of a film, and developability and sensitivity of the positive photosensitive resin composition for an alkali aqueous solution.

The organic dye may have solubility of about 1 to about 10 wt % in a solvent. Within the above numeral ranges, precipitation of the dye in the photosensitive resin composition may be prevented. For example, the organic dye may have solubility of 1 to 10 wt % in a solvent such as N-methyl-2-pyrrolidone, γ-butyrolactone, N,N-dimethyl acetamide, dimethylsulfoxide, diethyleneglycoldimethylether, diethylene glycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycol acetate, 1,3-butyleneglycol-3-monomethylether, methyl pyruvate, ethyl pyruvate, methyl-3-methoxy propionate, cyclohexanone, and the like.

(E) Solvent

The solvent may be an organic solvent. Examples of the solvent may include without limitation N-methyl-2-pyrrolidone, gamma-butyrolactone, N,N-dimethyl acetamide, dimethylsulfoxide, diethyleneglycoldimethylether, diethyleneglycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, cyclohexanone, and the like. The solvent may be used singularly or as a mixture.

The photosensitive resin composition may include the solvent in an amount of about 100 to about 400 parts by weight based on about 100 parts by weight of the alkali soluble resin. When the solvent is included in an amount within the above range, a layer of a sufficient thickness may be coated, and solubility and coating properties may be improved.

(F) Silane Compound

The photosensitive resin composition may further a silane compound along with components (A) to (E), to improve adherence with a substrate.

The silane compound may be represented by the following Chemical Formula 31.

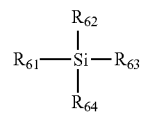

[Chemical Formula 31]

In Chemical Formula 31, $R_{61}$ is a vinyl group, substituted or unsubstituted alkyl, or substituted or unsubstituted aryl, for example 3-(methacryloxy)propyl, p-styryl, or 3-(phenylamino)propyl.

$R_{62}$ to $R_{64}$ are the same or different and are each independently substituted or unsubstituted alkoxy, substituted or unsubstituted alkyl, or halogen, wherein at least one of the $R_{62}$ to $R_{64}$ is alkoxy or halogen, and the alkoxy may be C1 to C8 alkoxy, and the alkyl may be C1 to C20 alkyl.

Examples of the silane compound may include without limitation compounds represented by the following Chemical Formulae 32 and 33; aryl group-containing silane compounds such as trimethoxy[3-(phenylamino)propyl]silane and the like; carbon-carbon unsaturated-containing silane compounds such as vinyltrimethoxysilane, vinyltriethoxysilane, vinyl trichlorosilane, vinyltris(β-methoxyethoxy)silane; 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane, and the like, and combinations thereof. In one embodiment, vinyltrimethoxysilane, or vinyltriethoxysilane may be used.

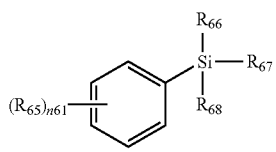

[Chemical Formula 32]

In Chemical Formula 32, $R_{65}$ is $NH_2$ or $CH_3CONH$, $R_{66}$ to $R_{68}$ are the same or different and are each independently substituted or unsubstituted alkoxy, for example $OCH_3$ or $OCH_2CH_3$, and $n_{61}$ is an integer of 1 to 5.

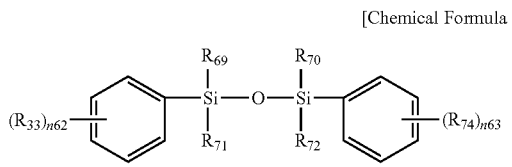

[Chemical Formula 33]

In Chemical Formula 33, $R_{69}$ to $R_{72}$ are the same or different and are each independently substituted or unsubstituted alkyl or substituted or unsubstituted alkoxy, for example $CH_3$ or $OCH_3$, and $R_{73}$ and $R_{74}$ are the same or different and are each independently substituted or unsubstituted amino, for example $NH_2$ or $CH_3CONH$, and $n_{62}$ and $n_{63}$ are the same or different and are each independently an integer of 1 to 5.

The photosensitive resin composition may include the silane compound in an amount of about 0.1 to about 30 parts by weight based on about 100 parts by weight of the alkali soluble resin. In some embodiments, the photosensitive resin composition may include silane compound in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of silane compound can be in a range from about any of the foregoing amounts to about any other of the foregoing amounts.

When the silane compound is included in an amount within the above range, the layer can have excellent adherence to upper and lower layers and minimal or no residue after development, and improved mechanical properties such as optical properties (transmittance) and tensile strengths, elongation rates, Young's modulus, and the like.

(G) Other Additive(s)

The positive photosensitive resin composition may further include one or more other additive(s) (G) in addition to the above-described (A) to (E) components.

The other additive can include a latent thermal acid generator. Examples of the latent thermal acid generator include without limitation arylsulfonic acids such as p-toluenesulfonic acid, benzenesulfonic acid, and the like; perfluoroalkylsulfonic acids such as trifluoromethanesulfonic acid, trifluorobutanesulfonic acid, and the like; alkylsulfonic acids such as methanesulfonic acid, ethanesulfonic acid, butanesulfonic acid, and the like; and combinations thereof.

The latent thermal acid generator is a catalyst for a dehydration reaction and a cyclization reaction of the polybenzoxazole precursor that is polyamide including a phenolic hydroxy group, and thus a cyclization reaction may be performed smoothly even if curing temperature is decreased.

In addition, the positive photosensitive resin composition may further include an additive such as a suitable surfactant and/or leveling agent to prevent staining of the layer and/or to improve development.

An exemplary process for forming a pattern using the positive photosensitive resin composition according to one embodiment includes: coating a positive photosensitive resin composition on a supporting substrate; drying the coated positive photosensitive resin composition to provide a positive photosensitive polybenzoxazole precursor layer; exposing the polybenzoxazole precursor layer; developing the exposed polybenzoxazole precursor layer with an alkali aqueous solution to provide a photosensitive resin layer; and baking photosensitive resin layer. The process of providing a pattern including the coating, exposing, and developing processes are widely known in this art, so detailed descriptions thereof will be omitted in this specification.

According to another embodiment, a photosensitive resin layer prepared using the positive photosensitive resin composition is provided. The photosensitive resin layer may be used in an insulation layer, a buffer layer, or a protective layer.

According to further another embodiment, a display device including the photosensitive resin layer prepared using the positive photosensitive resin composition is provided. The photosensitive resin layer may be used in an insulation layer, a buffer layer, or a protective layer.

According to further another embodiment, a display device including the photosensitive resin layer is provided. The display device may be an organic light emitting diode (OLED) or a liquid crystal display (LCD).

The following examples illustrate the present invention in more detail. However, it is understood that the present invention is not limited by these examples.

Synthesis Example 1

Synthesis of Polybenzoxazole Precursor (PBO-A)

41.1 g of 2,6-bis[[[5-[1-(amino-4-hydroxyphenyl)-2,2,2-trifluoro-1-(trifluoromethyl)ethyl]-2-hydroxyphenyl]amino]methyl]-4-methylphenol is dissolved in 280 g of N-methyl-2-pyrrolidone (NMP) in a four-necked flask mounted with an agitator, a temperature controlling device, a nitrogen gas injector, and a condenser while nitrogen is passed therethrough. When a solid is completely dissolved, 9.9 g of pyridine is added to the solution. The mixture is maintained at a temperature ranging from 0 to 5° C., and a solution prepared by dissolving 13.3 g of 4,4'-oxydibenzoylchloride in 142 g of N-methyl-2-pyrrolidone (NMP) is slowly added thereto in a dropwise fashion for 30 minutes. The resulting mixture is reacted for 1 hour at 0° C. to 5° C. to room temperature and the temperature is increased to room temperature and then the mixture is agitated for one hour, completing the reaction.

Herein, 1.6 g of 5-norbornene-2,3-dicarboxyl anhydride is added to the reactant. The mixture is agitated at 70° C. for 24 hours, completing the reaction. The reaction mixture is added to a solution prepared by mixing water/methanol in a volume ratio of 10/1 to produce a precipitate. The precipitate is filtrated, sufficiently rinsed with water, and dried at 80° C. under vacuum for 24 hours, preparing a polybenzoxazole precursor (PBO-A) having a weight average molecular weight of 9,500.

Example 1

100 parts by weight of the polybenzoxazole precursor (PBO-A) according to Synthesis Example 1 is added to 350 parts by weight of γ-butyrolactone (GBL), and 10 parts by weight of photosensitive diazoquinone having a structure of the following Chemical Formula 34, 0.2 parts by weight of trimethoxy[3-(phenylamino)propyl]silane represented by the following Chemical Formula 35, and 7.5 parts by weight of a phenol compound represented by the following Chemical Formula 36 are added thereto and dissolved therein, obtaining a resin mixture. 4 parts by weight of red dye CF R007 (Kyung-In Synthetic Corporation) represented by the following Chemical Formula 29 and 1 part by weight of an azo-based orange dye CF O011 (Kyung-In Synthetic Corporation) represented by the following Chemical Formula 30 are dissolved in cyclohexanone in 10 wt % and then added into the resin mixture and stabilized by agitating at room temperature for 3 hours and filtered with a 0.45 μm film of a fluorine resin to provide a positive photosensitive resin composition.

[Chemical Formula 34]

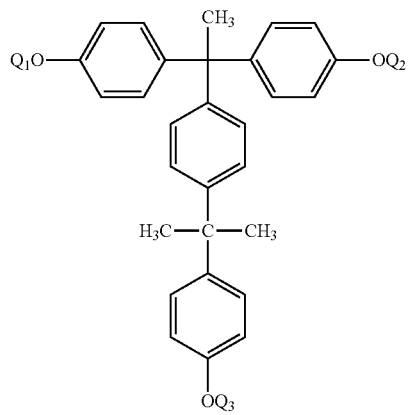

In Chemical Formula 34, two of $Q_1$, $Q_2$ and $Q_3$ are

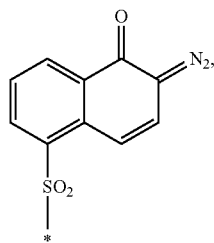

and the remaining group is hydrogen.

[Chemical Formula 35]

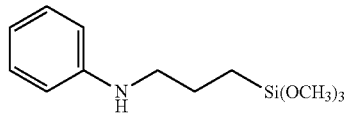

[Chemical Formula 36]

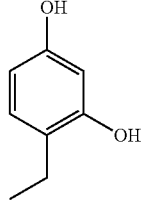

[Chemical Formula 29]

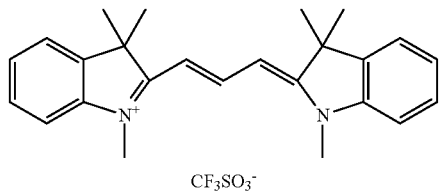

$CF_3SO_3^-$

[Chemical Formula 30]

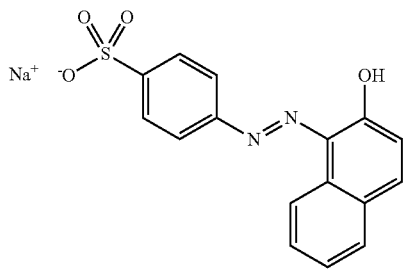

Example 2

A positive photosensitive resin composition is prepared in accordance with the same procedure as in Example 1, except for adding 8 parts by weight of red dye CF R007 represented by Chemical Formula 29 and 2 parts by weight of azo-based orange dye CF O011 represented by Chemical Formula 30 thereto.

Example 3

A positive photosensitive resin composition is prepared in accordance with the same procedure as in Example 1, except for adding 16 parts by weight of red dye CF R007 represented by Chemical Formula 29 and 4 parts by weight of azo-based orange dye CF O011 represented by Chemical Formula 30 thereto.

Example 4

A positive photosensitive resin composition is prepared in accordance with the same procedure as in Example 1, except for adding 24 parts by weight of red dye CF R007 represented by Chemical Formula 29 and 6 parts by weight of azo-based orange dye CF O011 represented by Chemical Formula 30 thereto.

Example 5

A positive photosensitive resin composition is prepared in accordance with the same procedure as in Example 1, except for adding 32 parts by weight of red dye CF R007 represented by Chemical Formula 29 and 8 parts by weight of azo-based orange dye CF O011 represented by Chemical Formula 30 thereto.

Comparative Example 1

100 parts by weight of the polybenzoxazole precursor (PBO-A) according to Synthesis Example 1 is added to 350 parts by weight of γ-butyrolactone (GBL), and 10 parts by weight of photosensitive diazoquinone having a structure of the above Chemical Formula 34, 0.2 parts by weight of trimethoxy[3-(phenylamino)propyl]silane represented by the above Chemical Formula 35, and 7.5 parts by weight of a phenol compound represented by the above Chemical Formula 36 are added thereto and dissolved therein, then stabilized by agitating at room temperature for 3 hours and filtered with a 0.45 µm filter of fluorine resin to provide a positive photosensitive resin composition.

Comparative Example 2

A positive photosensitive resin composition is prepared in accordance with the same procedure as in Example 1, except for adding 0.4 parts by weight of red dye CF R007 represented by Chemical Formula 29 and 0.1 part by weight of azo-based orange dye CF O011 represented by Chemical Formula 30 thereto.

Comparative Example 3

A positive photosensitive resin composition is prepared in accordance with the same procedure as in Example 1, except for adding 40 parts by weight of red dye CF R007 represented by Chemical Formula 29 and 10 parts by weight of azo-based orange dye CF O011 represented by Chemical Formula 30 thereto.

Table 1 shows the compositions and the contents of Examples 1 to 5 and Comparative Examples 1 to 3.

room temperature through two puddles to dissolve and remove the exposed parts, and rinsed with pure water for 30 seconds. Then, the patterns are cured under an oxygen concentration of less than or equal to 1000 ppm at 250° C./60 minutes using an electric oven.

(2) Film Residue Ratio

The pre-baked film is developed in a 2.38% tetramethylammonium hydroxide (TMAH) aqueous solution at 23° C./60 seconds and then rinsed with pure water for 60 seconds and dried and measured for thickness changes which are calculated according to the following Equation 1.

Film residue ratio=(thickness after development/initial thickness before development)*100    [Equation 1]

○: greater than or equal to 95% of film residue ratio
Δ: film residue ratio ranging from 80 to 95%
X: less than or equal to 80% of film residue ratio (3) Sensitivity Sensitivity of the polyimide precursor films is evaluated by measuring exposure time when 10 µm L/S pattern has a 1:1 line width after the exposure and development as an optimal exposure time. Herein, a minimum pattern dimension in the optima exposure time is regarded as a resolution reference.

○: Excellent sensitivity (less than or equal to 50 mJ/cm$^2$)
Δ: Average sensitivity (50 to 200 mJ/cm2)
X: Low sensitivity (greater than or equal to 200 mJ/cm$^2$)

(4) Residue Evaluation

The patterns fabricated using the photosensitive resin compositions according to Example 1 to 5 and Comparative Example 1 to 3 are evaluated for residue levels using an optical microscope in accordance with the following references.

○: Many residues
Δ: Medium residues
X: No residue (5) Luminance Evaluation

Luminance (white luminance) of modules fabricated using the photosensitive resin compositions according to Example 1 to 5 and Comparative Example 1 to 3 are measured using a

TABLE 1

| | Amount (parts by weight) | | | | | | | |
|---|---|---|---|---|---|---|---|---|
| | Comp. Ex. 1 | Comp. Ex. 2 | Comp. Ex. 3 | Ex. 1 | Ex. 2 | Ex. 3 | Ex. 4 | Ex. 5 |
| PBO precursor | 100 | 100 | 100 | 100 | 100 | 100 | 100 | 100 |
| Diazoquinone compound | 10 | 10 | 10 | 10 | 10 | 10 | 10 | 10 |
| Silane compound | 0.2 | 0.2 | 0.2 | 0.2 | 0.2 | 0.2 | 0.2 | 0.2 |
| Phenol compound | 7.5 | 7.5 | 7.5 | 7.5 | 7.5 | 7.5 | 7.5 | 7.5 |
| PGME | 250 | 250 | 250 | 250 | 250 | 250 | 250 | 250 |
| GBL | 100 | 100 | 100 | 100 | 100 | 100 | 100 | 100 |
| Red dye | 0 | 0.4 | 40 | 4 | 8 | 16 | 24 | 32 |
| Orange dye | 0 | 0.1 | 10 | 1 | 2 | 4 | 6 | 8 |
| Cyclohexane | 0 | 45 | 900 | 45 | 90 | 180 | 270 | 450 |

<Properties Measurement>

(1) Formation of Film and Pattern

The positive photosensitive resin compositions according to Examples 1 to 5 and Comparative Examples 1 to 3 are coated on an ITO glass and heated on a hot plate at 130° C./2 minutes, forming photosensitive polyimide precursor films.

The polyimide precursor films are exposed to a light using a mask having variously-sized patterns and an I-line stepper (NSR i10C, Nikon Co.), dipped in a 2.38% tetramethyl ammonium hydroxide aqueous solution for 40 seconds at Minolta luminance meter (Display color analyzer CA-210). The luminance is measured 10 minute later after supplying the modules with electricity for stabilization. In an 8 bit digital system, when R/G/B all have values of 0, black is displayed, while when R/G/B all have values of 255, white is displayed. When R/G/B has values of (255, 0, 0), pure red is displayed, when R/G/B has values of (0, 255, 0), green is displayed, and when R/G/B has values of (0, 0, 255), pure blue is displayed, by giving a signal to one of three primary colors. Accordingly, when each R, G, and B luminance is measured and added up, the sum should be theoretically equal to white luminance. However, the white luminance may not be obtained according to W=(R+G+B)/3 depending on characteristics of each display. The reason is that each R, G, and B channel has no completely independent characteristics but a light leakage in a particular color. In order to evaluate efficiency of preventing a light leakage, a green pixel is designed to have a light leakage, and its white luminance is measured using a Minolta luminance meter.

○: excellent luminance (W value of greater than 250)
Δ: average luminance (W value of 245 to 250)
X: low luminance (W value of less than 245)

(6) Dielectric Constant

The photosensitive resin compositions are coated on an ITO glass and heated on a hot plate at 130° C./2 minutes to provide 2.0 to 2.5 μm thick films. A metal electrode (Au) having a diameter of 300 μm is deposited on the films, preparing samples. The capacitance of the samples is measured using a HP 4294A precision impedance analyzer, and the measurement is used to calculate a dielectric constant according to the following Equation 2.

$$C = \epsilon_0 * \epsilon * A/d \quad \text{[Equation 2]}$$

In the Equation, C denotes capacitance, $\epsilon_0$ denotes a dielectric constant under vacuum, $\epsilon$ denotes a non-dielectric constant, A denotes an electrode area, and d denotes the thickness of the films.

○: dielectric constant of less than or equal to 5.5
X: dielectric constant of greater than 5.5

The properties of the films according to Examples 1 to 5 and Comparative Examples 1 to 3 are provided in the following Table 2.

TABLE 2

| | Film residue ratio | Sensitivity | Residue | Luminance | Dielectric constant |
|---|---|---|---|---|---|
| Comparative Example 1 | ○ | ○ | Δ | X | ○ |
| Comparative Example 2 | ○ | ○ | Δ | X | ○ |
| Comparative Example 3 | X | X | ○ | ○ | ○ |
| Example 1 | ○ | ○ | ○ | Δ | ○ |
| Example 2 | ○ | ○ | ○ | ○ | ○ |
| Example 3 | ○ | ○ | ○ | ○ | ○ |
| Example 4 | Δ | Δ | ○ | ○ | ○ |
| Example 5 | Δ | Δ | ○ | ○ | ○ |

As shown in Table 2, the photosensitive resin composition according to Comparative Example 1 including no organic dye did not absorb light leaked from the pixel layer at all, which deteriorates luminance. In addition, the photosensitive resin composition according to Comparative Example 2 including organic dye in an amount of only 0.5 parts by weight based on 100 parts by weight of PBO precursor also did not fully prevent light leakage, and the photosensitive resin composition has low dissolubility to the alkali aqueous solution to increase occurring residues.

On the other hand, in the case of Comparative Example 3 including organic dye in an amount of greater than or equal to 40 parts by weight based on 100 parts by weight of PBO precursor, the film residue ratio and the sensitivity are significantly deteriorated, the coating property is inferior, and a plane thin film is hardly obtained.

From the results, it is confirmed that when the organic dye is included in an amount less than 1 part by weight based on 100 parts by weight of soluble resin, the effects of preventing the light leakage are not satisfied; and when the organic dye is included in an amount greater than 40 parts by weight, the film residue ratio, the sensitivity, the coating property and the like deteriorate.

However, from the results of Examples 1 to 5, it is understood that the positive photosensitive resin compositions including dye represented by Chemical Formulae 29 and 30 in an amount of about 1 to about 40 parts by weight range based on about 100 parts by weight of PBO precursor increases the white luminance without deteriorating film residue ratio and sensitivity, to thereby effectively prevent light leakage and improve the contrast ratio and the color purity, and the efficiency of final products. In addition, according to Examples 1 to 5, the dye did not include a metal element, so the dielectric constant is not changed.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition, comprising
(A) an alkali soluble resin including a polybenzoxazole precursor, a polyimide precursor, or a combination thereof;
(B) a photosensitive diazoquinone compound;
(C) a phenol compound;
(D) at least one organic dye having an absorption wavelength of about 400 to about 700 nm; and
(E) a solvent,
wherein the organic dye (D) is included in an amount of about 1 to about 40 parts by weight based on about 100 parts by weight of the alkali soluble resin (A) and
wherein the organic dye (D) comprises a methine-based compound represented by the following Chemical Formula 28:

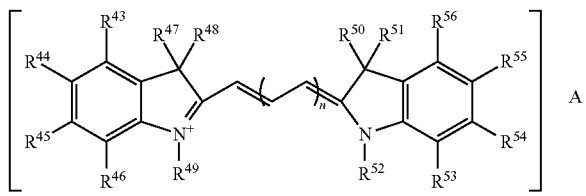

[Chemical Formula 28]

wherein, in Chemical Formula 28,
$R^{43}$ to $R^{46}$ and $R^{53}$ to $R^{56}$ are the same or different and are each independently hydrogen, halogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $R^{47}$, $R^{48}$, $R^{50}$ and $R^{51}$ are the same or different and are each independently hydrogen or substituted or unsubstituted C1 to C20 alkyl, $R^{49}$ and $R^{52}$ are the same or different and are each independently hydrogen, substituted or unsubstituted C1 to C20 alkyl, substituted or unsubstituted C1 to C20 alkyl (meth)acrylate, or substituted or unsubstituted C6 to C30 aryl, n is an integer ranging from 1 to 4, and A is halogen, $ClO_4^-$, $BF_4^-$, $SbF_6^-$, $CF_3SO_3^-$ or $N(SO_2CF_2)_2^-$.

2. The positive photosensitive resin composition of claim 1, wherein the polybenzoxazole precursor comprises a repeating unit represented by the following Chemical Formula 1, or repeating units represented by the following Chemical Formulae 1 and 2, and comprises a thermally polymerizable functional group at at least one terminal end thereof:

[Chemical Formula 1]

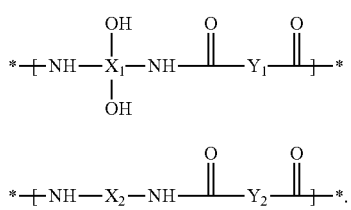

[Chemical Formula 2]

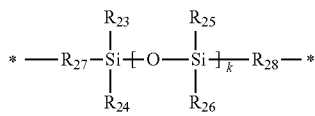

wherein, in Chemical Formulae 1 and 2, $X_1$ is an aromatic organic group or tetravalent to hexavalent aliphatic organic group, $Y_1$ and $Y_2$ are the same or different and each are independently an aromatic organic group or divalent to hexavalent aliphatic organic group, and $X_2$ is an aromatic organic group, divalent to hexavalent aliphatic organic group, divalent to hexavalent alicyclic organic group, or an organic group represented by the following Chemical Formula 3,

[Chemical Formula 3]

*——$R_{27}$—Si$\begin{array}{c}R_{23}\\|\\|\\R_{24}\end{array}$+O—Si$\begin{array}{c}R_{25}\\|\\|\\R_{26}\end{array}$$\}_k$—$R_{28}$—* wherein, in Chemical Formula 3, $R_{23}$ to $R_{26}$ are the same or different and are each independently substituted or unsubstituted alkyl, substituted or unsubstituted aryl, substituted or unsubstituted alkoxy, or hydroxy, $R_{27}$ and $R_{28}$ are the same or different and are each independently substituted or unsubstituted alkylene or substituted or unsubstituted arylene, and k is an integer ranging from 1 to 50.

3. The positive photosensitive resin composition of claim 2, wherein the thermally polymerizable functional group is derived from a reactive end-capping monomer including a monoamine including carbon-carbon double bonds, a monoanhydride including carbon-carbon double bonds, or a combination thereof.

4. The positive photosensitive resin composition of claim 3, wherein the monoanhydride including the carbon-carbon double bond comprises 5-norbornene-2,3-dicarboxyl anhydride represented by the following Chemical Formula 9; 3,6-epoxy-1,2,3,6-tetra hydrophthalic anhydride represented by the following Chemical Formula 10; isobutenyl succinic anhydride represented by the following Chemical Formula 11; maleic anhydride; aconitic anhydride, or a combination thereof

[Chemical Formula 9]

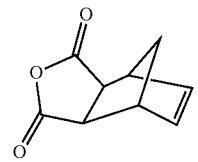

[Chemical Formula 10]

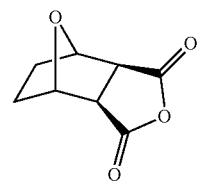

[Chemical Formula 11]

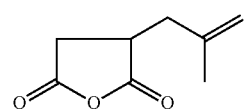

5. The positive photosensitive resin composition of claim 1, wherein the polyimide precursor comprises repeating units represented by the following Chemical Formula 50 and the following Chemical Formula 51:

[Chemical Formula 50]

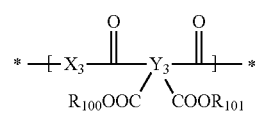

[Chemical Formula 51]

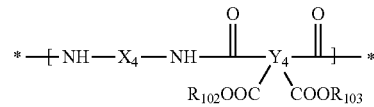

wherein, in Chemical Formulae 50 and 51, $X_3$ is an aromatic organic group or divalent to hexavalent alicyclic organic group, $Y_3$ and $Y_4$ are the same or different, and are independently an aromatic organic group, or tetravalent to hexavalent alicyclic organic groups, $X_4$ is an aromatic organic group, divalent to hexavalent alicyclic organic group, or a functional group represented by the above Chemical Formula 3, and $R_{100}$ to $R_{103}$ are the same or different and are each independently hydrogen or substituted or unsubstituted C1 to C20 alkyl.

6. The positive photosensitive resin composition of claim 1, wherein the organic dye (D) has an absorption wavelength of about 590 nm to about 700 nm.

7. The positive photosensitive resin composition of claim 1, wherein the methine-based compound comprises a compound represented by the following Chemical Formula 29:

[Chemical Formula 29]

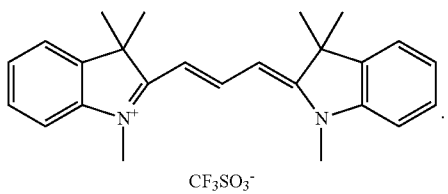

8. The positive photosensitive resin composition of claim 1, wherein the organic dye (D) further comprises an azo-based compound, and the azo-based compound comprises a compound represented by the following Chemical Formula 30

[Chemical Formula 30]

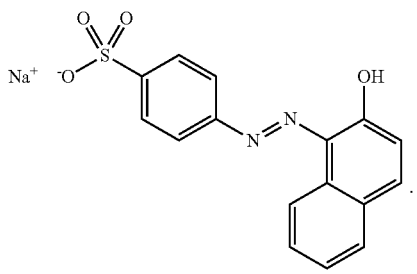

9. The positive photosensitive resin composition of claim 1, wherein the solvent (E) comprises N-methyl-2-pyrrolidone, γ-butyrolactone, N,N-dimethyl acetamide, dimethylsulfoxide, diethyleneglycoldimethylether, diethyleneglycoldiethylether, diethyleneglycoldibutylether, propyleneglycolmonomethylether, dipropyleneglycolmonomethylether, propyleneglycolmonomethyletheracetate, methyllactate, ethyllactate, butyllactate, methyl-1,3-butyleneglycolacetate, 1,3-butyleneglycol-3-monomethylether, methyl pyruvate, ethyl pyruvate, methyl-3-methoxy propionate, cyclohexanone, or a combination thereof.

10. The positive photosensitive resin composition of claim 1, wherein the positive photosensitive resin composition further comprises a silane compound.

11. The positive photosensitive resin composition of claim 1, wherein the positive photosensitive resin composition comprises:
about 5 to about 100 parts by weight of the photosensitive diazoquinone compound (B),
about 1 to about 30 parts by weight of the phenol compound (C), and
about 100 to about 400 parts by weight of the solvent (E), based on about 100 parts by weight of the alkali soluble resin (A).

12. A photosensitive resin layer prepared using the positive photosensitive resin composition of claim 1.

13. A display device including the photosensitive resin layer of claim 12.

14. The positive photosensitive resin composition of claim 1, wherein the organic dye (D) further comprises an azo-based compound, wherein the methine-based compound and the azo-based compound are included in a weight ratio of 9:1 to 5:5.

* * * * *

UNITED STATES PATENT AND TRADEMARK OFFICE
CERTIFICATE OF CORRECTION

PATENT NO.        : 8,921,019 B2
APPLICATION NO.   : 13/603479
DATED             : December 30, 2014
INVENTOR(S)       : Ji-Yun Kwon et al.

Page 1 of 3

It is certified that error appears in the above-identified patent and that said Letters Patent is hereby corrected as shown below:

In the Specification

Column 8, Chemical Formula 4 is depicted as:

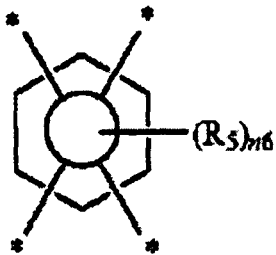

and should be depicted as:

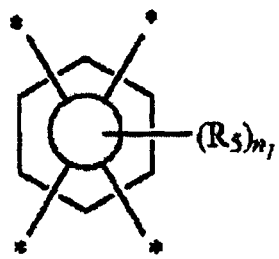

Column 11, Line 55 reads: "In Chemical Formula 15, $R_{10}$ is H or $CH_3$, and $R_{20}$ is $CH_2$"
and should read: "In Chemical Formula 15, $R_{19}$ is H or $CH_3$, and $R_{20}$ is $CH_2$"

Column 15, Chemical Formula 22 is depicted as:

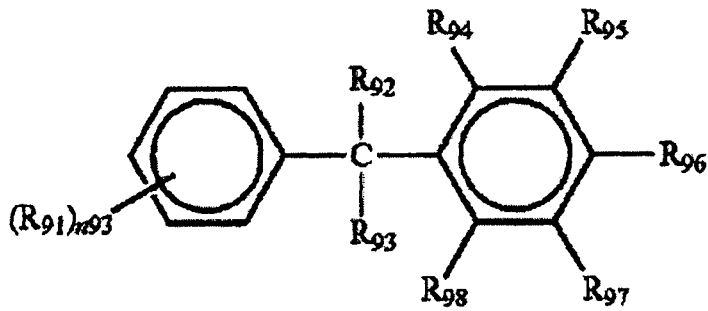

Signed and Sealed this
Twenty-sixth Day of May, 2015

Michelle K. Lee
*Director of the United States Patent and Trademark Office*

CERTIFICATE OF CORRECTION (continued)
U.S. Pat. No. 8,921,019 B2 and should be depicted as:

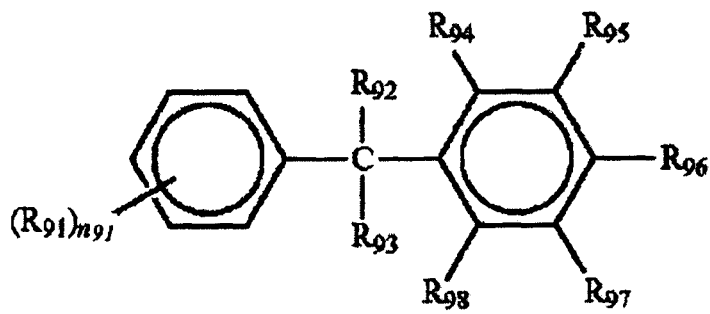

Column 16, Line 46 reads: "$n_{107}+n_{10s}$, $n_{109}+n_{110}$, and $n_{111}+n_{112}$ are the same or differ-" and should read: "$n_{107}+n_{108}$, $n_{109}+n_{110}$, and $n_{111}+n_{112}$ are the same or differ-"

Column 16, Chemical Formula 27 is depicted as:

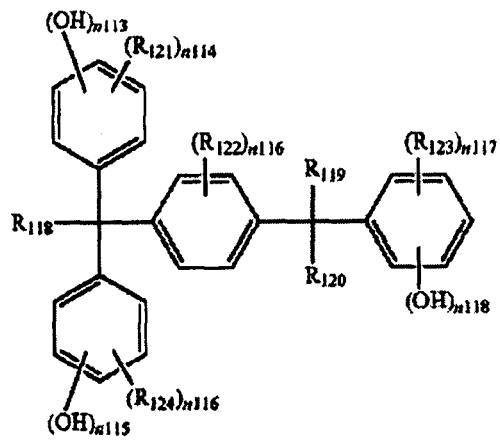

and should be depicted as:

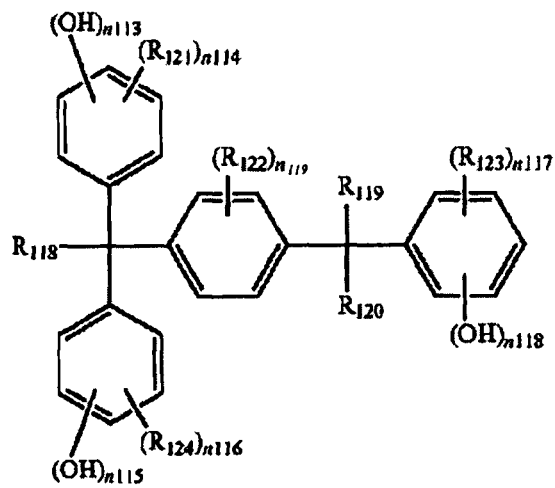

CERTIFICATE OF CORRECTION (continued)
U.S. Pat. No. 8,921,019 B2

Column 17, Line 11 reads: "$n_{119}$ is an integer of 1 to 4, and $n_{117}+n_{118}$ are the same or"
and should read: "$n_{119}$ is an integer of 1 to 4, and $n_{113}+n_{114}$, $n_{115}+n_{116}$, and $n_{117}+n_{118}$ are the same or"

Column 21, Chemical Formula 33 is depicted as:

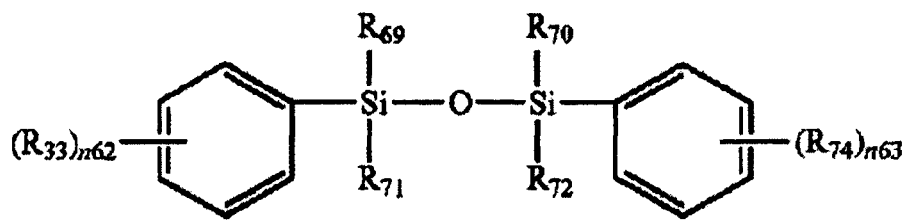

and should be depicted as:

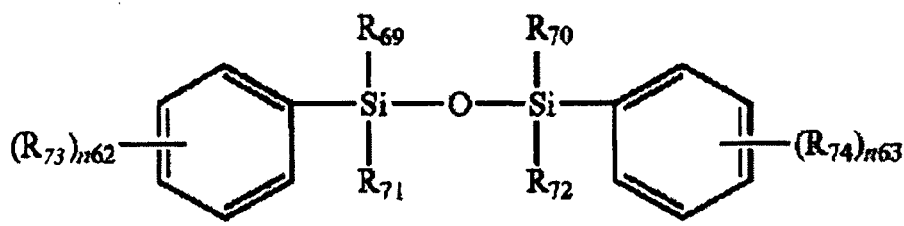

In the Claims

In Claim 1, Column 29, Line 15 reads: "$CF_2)_2^-$." and should read: "$CF_3)_2^-$."